United States Patent
Lee (10) Patent No.: US 11,455,371 B2
(45) Date of Patent: Sep. 27, 2022

(54) COMPUTATION CIRCUIT FOR PERFORMING VECTOR-MATRIX MULTIPLICATION AND SEMICONDUCTOR DEVICE INCLUDING THE COMPUTATION CIRCUIT

(71) Applicants: SK hynix Inc., Icheon (KR); Donguk Lee, Jeju (KR)

(72) Inventor: Donguk Lee, Jeju (KR)

(73) Assignees: SK hynix Inc., Icheon (KR); Donguk Lee, Jeju (KR)

( * ) Notice: Subject to any disclaimer, the term of this patent is extended or adjusted under 35 U.S.C. 154(b) by 302 days.

(21) Appl. No.: 16/822,643

(22) Filed: Mar. 18, 2020

(65) Prior Publication Data

US 2020/0410040 A1    Dec. 31, 2020

(30) Foreign Application Priority Data

Jun. 28, 2019    (KR) .......................... 10-2019-0077865

(51) Int. Cl.
  *G06F 17/16*    (2006.01)
  *G11C 11/4093*    (2006.01)
  *G06G 7/16*    (2006.01)

(52) U.S. Cl.
  CPC ............... *G06F 17/16* (2013.01); *G06G 7/16* (2013.01); *G11C 11/4093* (2013.01)

(58) Field of Classification Search
  CPC ... G11C 11/4093; G11C 11/565; G06F 17/16; G06G 7/16
  See application file for complete search history.

(56) References Cited

U.S. PATENT DOCUMENTS

| | | | |
|---|---|---|---|
| 10,255,954 B1* | 4/2019 | Nakaoka | G11C 7/1084 |
| 2015/0098263 A1* | 4/2015 | Hirayama | G11C 11/2275 365/145 |
| 2018/0373902 A1* | 12/2018 | Muralimanohar | G11C 13/00 |
| 2019/0042199 A1* | 2/2019 | Sumbul | G11C 11/4091 |
| 2019/0102359 A1* | 4/2019 | Knag | G06G 7/16 |
| 2020/0349217 A1* | 11/2020 | Luo | G11C 13/0069 |

OTHER PUBLICATIONS

Shimeng Yu, et al, "Binary neural network with 16 Mb RRAM macro chip for classification and online training", Electron Devices Meeting (IEDM) 2016 IEEE International, 2016, pp. 16.2.1-16.2.4.
Takamaeda-Yamazaki S., "Energy-Efficient In-Memory Neural Network Processor," The 17th International Forum on MPSoC for Software-defined Hardware (MPSoC 2017), Jul. 5, 2017, Les Tresoms Hotel, Annecy, France.
Norman P. Jouppi et al., "In-Datacenter Performance Analysis of a Tensor Processing Unit", http://arxiv.org/abs/1704.04760, Jun. 2017, In Proceedings of ISCA.

* cited by examiner

*Primary Examiner* — Michael D. Yaary (57) ABSTRACT

A computation circuit includes a computing cell array configured to provide a plurality of physical values respectively corresponding to a plurality of elements of a matrix; a vector input circuit configured to provide a plurality of input voltages corresponding to an input vector to the computing cell array; and a vector output circuit configured to output a plurality of output voltages each corresponding to a dot product between the input vector and a column vector of the matrix according to the plurality of input voltages and the plurality of effective capacitances.

17 Claims, 10 Drawing Sheets

COMPUTATION CIRCUIT FOR PERFORMING VECTOR-MATRIX MULTIPLICATION AND SEMICONDUCTOR DEVICE INCLUDING THE COMPUTATION CIRCUIT

CROSS-REFERENCE TO RELATED APPLICATIONS

The present application claims priority under 35 U.S.C. § 119(a) to Korean Patent Application No. 10-2019-0077865, filed on Jun. 28, 2019, which is incorporated herein by reference in its entirety.

BACKGROUND

1. Technical Field

Various embodiments may generally relate to a computation circuit for performing a vector-matrix multiplication and a semiconductor device including the computation circuit.

2. Related Art

Neural networks are widely used in artificial intelligence applications, such as image recognition and technologies used in autonomous vehicles.

Figure 1:
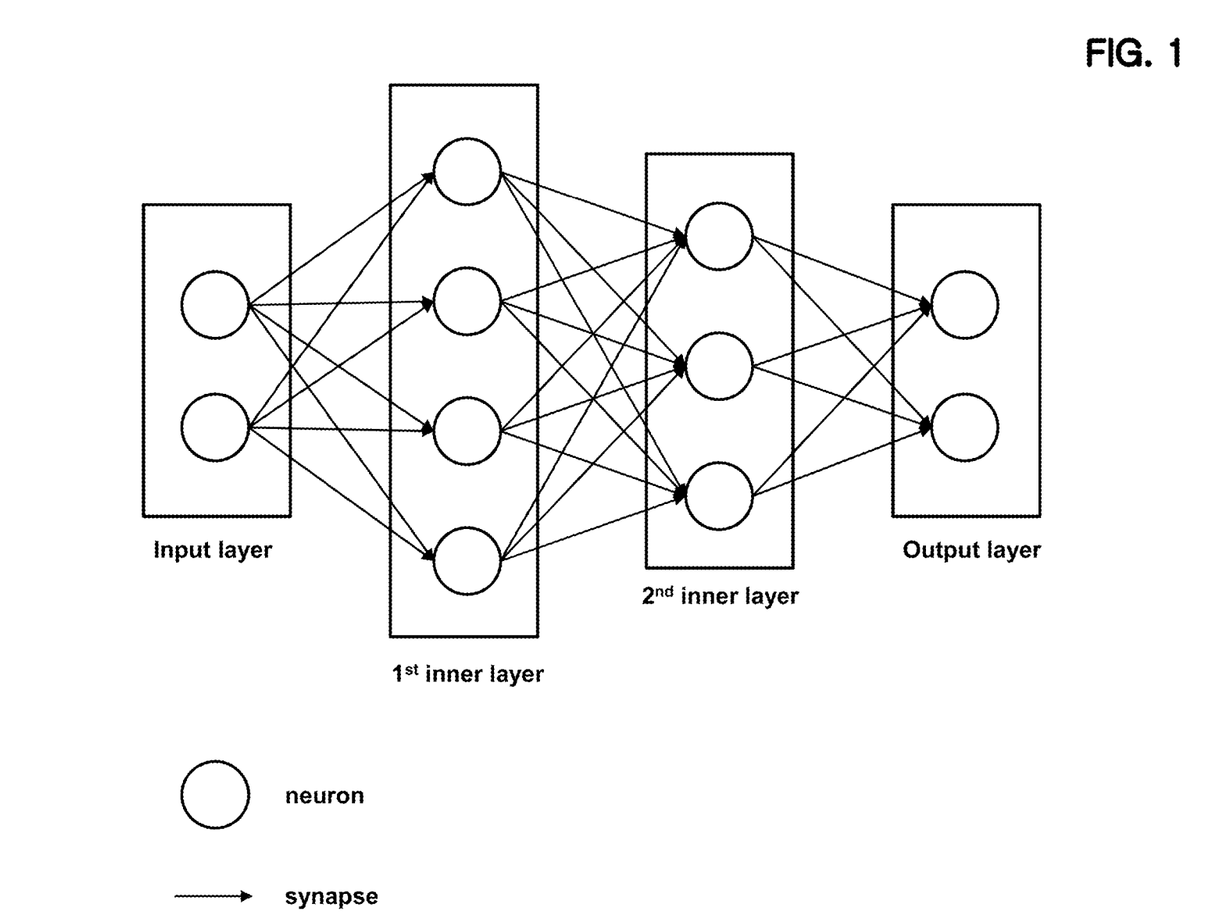
FIG. 1 is a block diagram illustrating a neural network.

FIG. 1 is a block diagram illustrating a structure of a neural network.

A neural network includes an input layer, an output layer, and one or more inner layers between the input layer and the output layer.

In FIG. 1, there are a first inner layer and a second inner layer between the input layer and the output layer.

Each of the output layer, the input layer, and the inner layers includes one or more neurons. Neurons contained in adjacent layers are coupled in various ways through synapses. For example, synapses point from neurons in a given layer to neurons in a next layer. Alternately or additionally, synapses point to neurons in a given layer from neurons in a previous layer.

Each of the neurons stores a value. The values of the neurons included in the input layer are determined according to an input signal, for example, an image to be recognized. The values of the neurons contained in the inner and output layers are based on the neurons and synapses contained in corresponding previous layers. For example, the values of the neurons in each of the inner layers are based on the values of the neurons in a preceding layer in the neural network.

Each of the synapses has a weight. The weight of each of the synapses is based on a training operation of the neural network.

Figure 2:
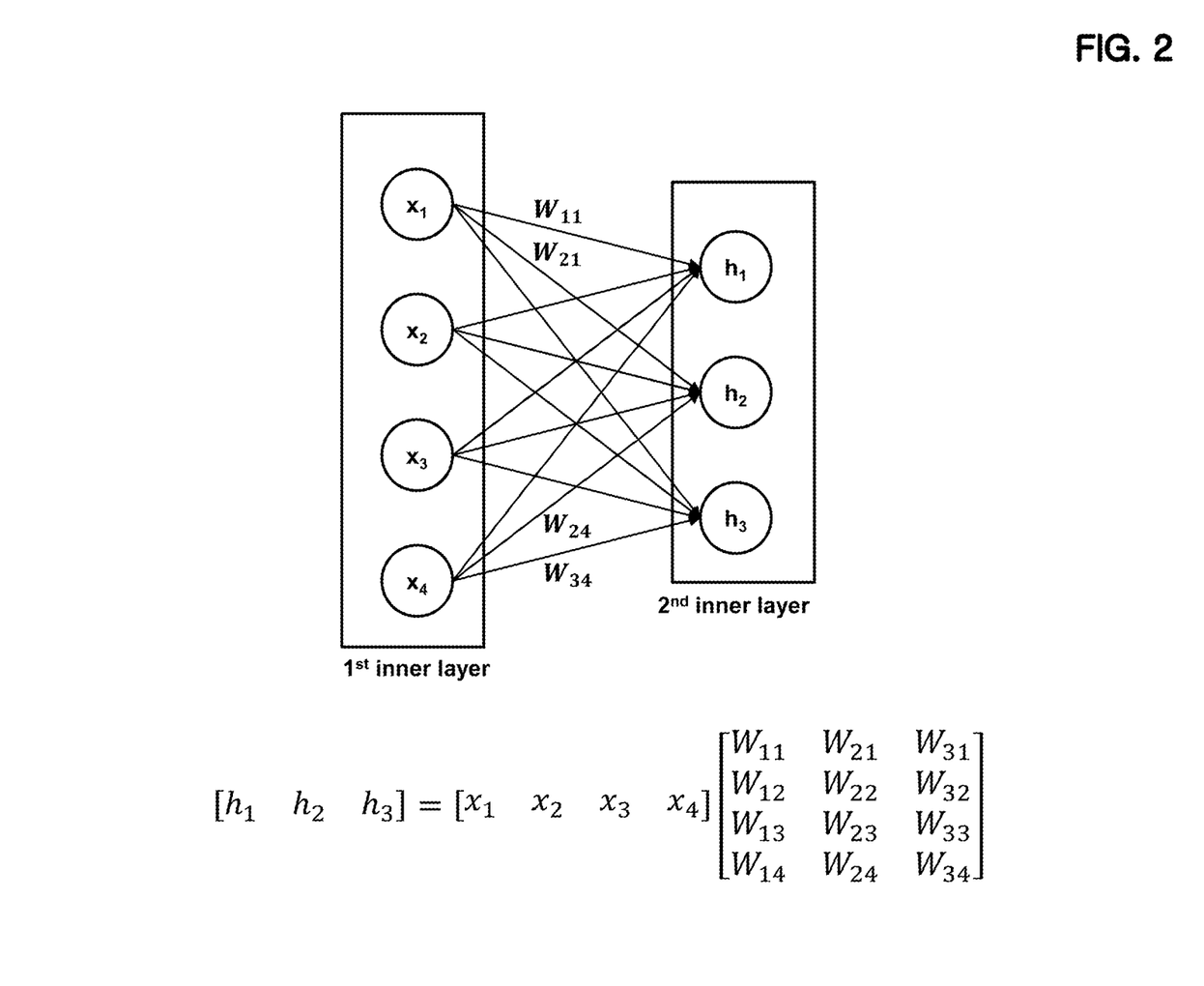
FIG. 2 is a block diagram illustrating an operation performed in the neural network.

FIG. 2 is a block diagram illustrating a computation operation to determine values of neurons in the second inner layer.

Neurons of the first inner layer is represented with a vector with 4 elements $[x_1\ x_2\ x_3\ x_4]$, neurons of the second inner layer is represented with a vector with 3 elements $[h_1\ h_2\ h_3]$, and synapses between the first inner layer and the second inner layer is represented with a matrix having 4 rows and 3 columns, wherein a synapse coupling a first element of the second inner layer to a first element of the first inner layer has a weight $W_{11}$, a synapse coupling a second element of the second inner layer to a first element of the first inner layer has a weight $W_{21}$, a synapse coupling a second element of the second inner layer to a fourth element of the first inner layer has a weight $W_{24}$, a synapse coupling a third element of the second inner layer to a fourth element of the first inner layer has a weight $W_{34}$, and so on. Accordingly, the first element of the second inner layer $h_1$ will have a value equal to $x_1 \cdot W_{11} + x_2 \cdot W_{12} + x_3 \cdot W_{13} + x_4 \cdot W_{14}$, the second element of the second inner layer $h_2$ will have a value equal to $x_1 \cdot W_{21} + x_2 \cdot W_{22} + x_3 \cdot W_{23} + x_4 \cdot W_{24}$, and the third element of the second inner layer $h_3$ will have a value equal to $x_1 \cdot W_{31} + x_2 \cdot W_{32} + x_3 \cdot W_{33} + x_4 \cdot W_{34}$.

As described above, in neural network operations, multiplication operations between a vector and a matrix are frequently performed, and importance of a computation circuit capable of performing the operations efficiently is increasing.

SUMMARY

In accordance with the present teachings, a computation circuit may include a computing cell array configured to provide a plurality of physical values respectively corresponding to a plurality of elements of a matrix; a vector input circuit configured to provide a plurality of input voltages corresponding to an input vector to the computing cell array; and a vector output circuit configured to output a plurality of output voltages each corresponding to a dot product between the input vector and a column vector of the matrix according to the plurality of input voltages and the plurality of effective capacitances.

In accordance with the present teachings, a semiconductor device may include a command decoder configured to receive a command and an address; a data input/output (IO) buffer configured to input or output data according to a control of the command decoder; and a computation circuit configured to generate a plurality of output voltages corresponding to product of an input vector provided from the data IO buffer and a matrix according to a control of the command decoder.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION

The following detailed description references the accompanying figures in describing illustrative embodiments consistent with this disclosure. The embodiments are provided for illustrative purposes and are not exhaustive. Additional embodiments not explicitly illustrated or described are possible. Further, modifications can be made to presented embodiments within the scope of the present teachings. The detailed description is not meant to limit this disclosure. Rather, the scope of the present disclosure is defined in accordance with the presented claims and equivalents thereof.

Figure 3:
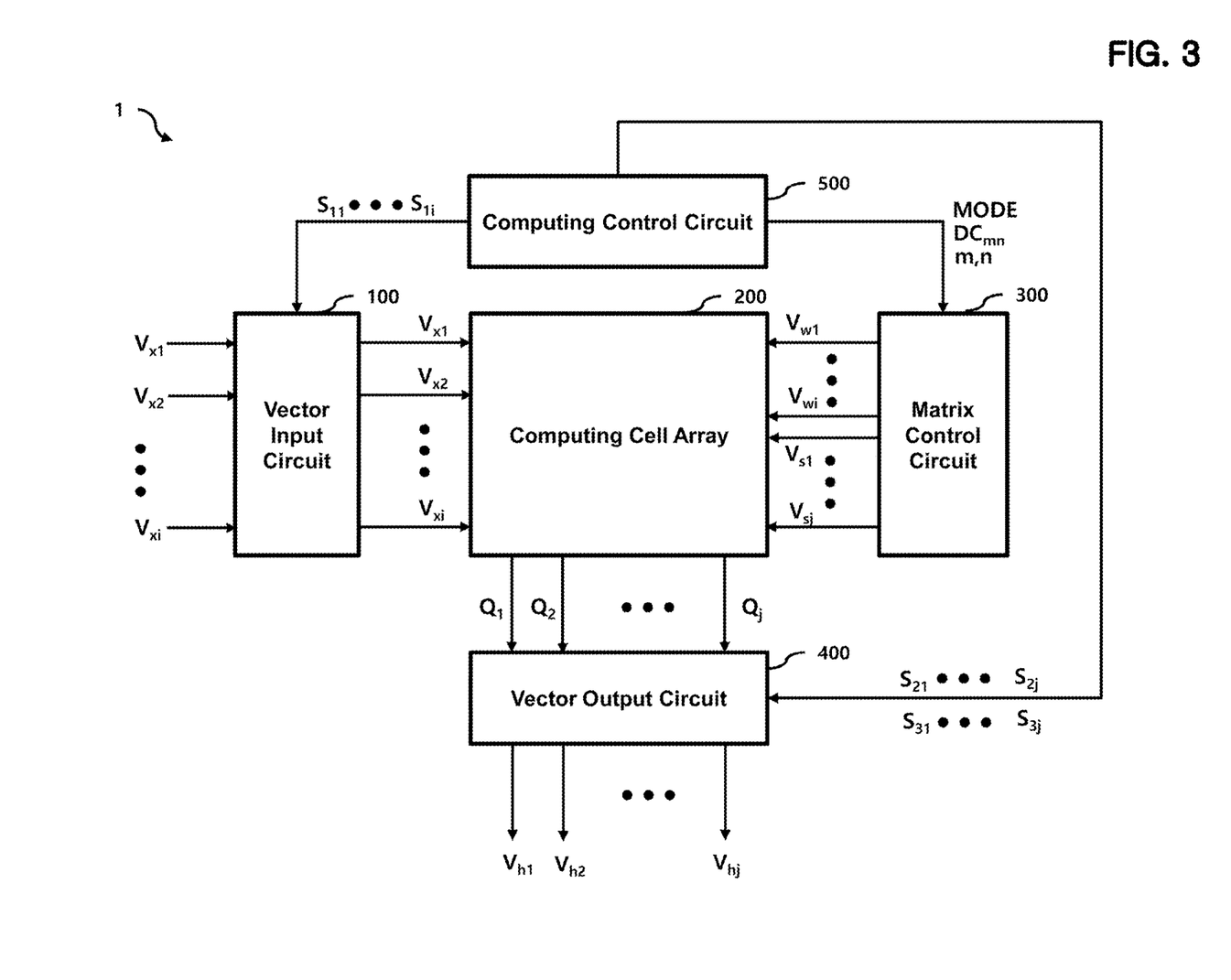
FIG. 3 is a block diagram illustrating a computation circuit according to an embodiment of the present disclosure.

FIG. 3 is a block diagram illustrating a computation circuit 1 according to an embodiment of the present disclosure.

The computation circuit 1 includes a vector input circuit 100, a computing cell array 200, a matrix control circuit 300, a vector output circuit 400, and a computing control circuit 500.

The computing control circuit 500 controls each component of the computation circuit 1 to perform a program operation or a computation operation.

For example, the computing control circuit 500 may provide an input switch control signal $S_{1m}$ ($1 \leq m \leq i$) to the vector input circuit 100 to control a vector input.

In addition, the computing control circuit 500 provides an operation mode signal MODE to the matrix control circuit 300, and provides element data $DC_{mn}$ and index signals m and n of the matrix so that data corresponding to each element of the matrix may be stored.

In addition, the computing control circuit 500 may provide the vector output circuit 400 with a sampling switch control signal $S_{2n}$ ($1 \leq n \leq j$) and a conversion switch control signal $S_{3n}$ ($1 \leq n \leq j$) to output the computation result.

Hereinafter, the detailed configuration and operation of the computation circuit 1 will be described with reference to FIGS. 4 to 9.

Figure 4:
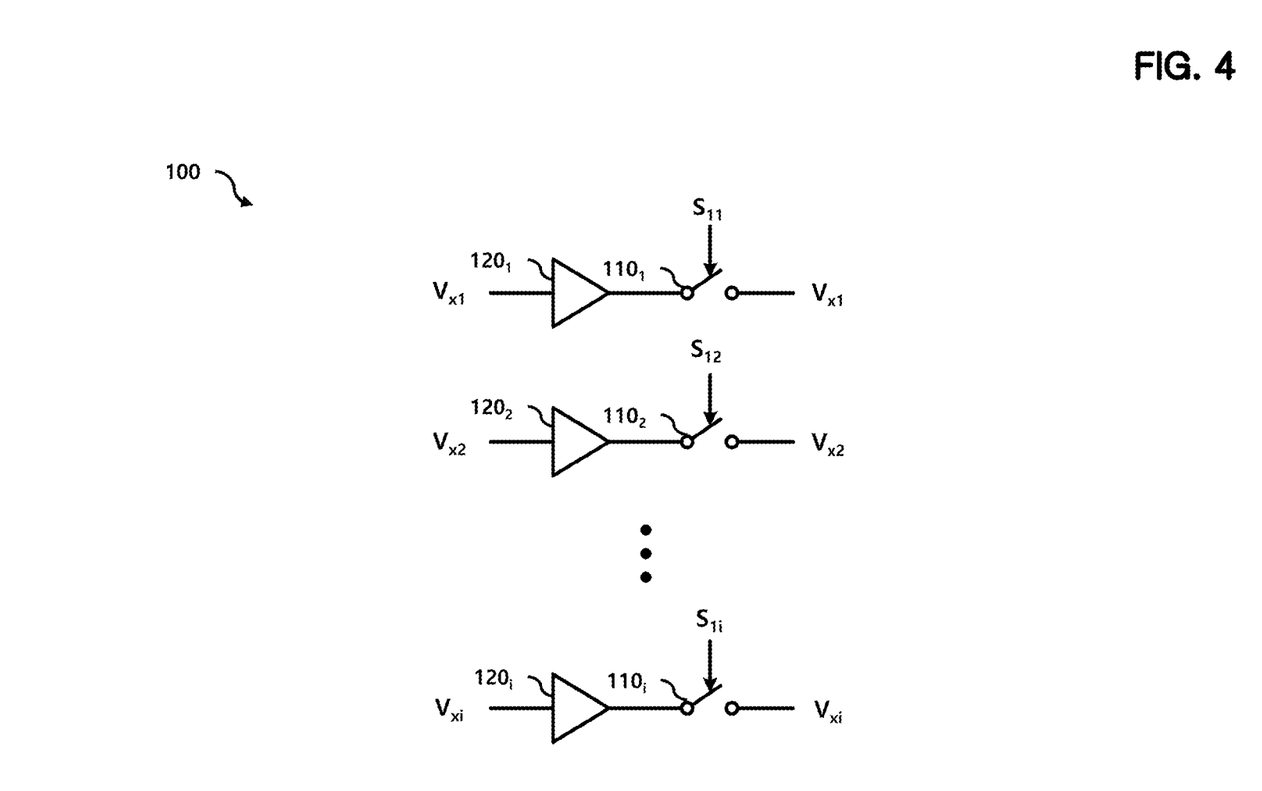
FIG. 4 is a block diagram illustrating a vector input circuit according to an embodiment of the present disclosure.

FIG. 4 is a block diagram illustrating a vector input circuit 100 according to an embodiment of the present disclosure.

The vector input circuit 100 provides a computing cell array 200 with input voltages $V_{x1}, V_{x2}, \ldots, V_{xi}$, where i is a natural number equal to or greater than 2, corresponding to a plurality of elements included in the input vector.

The vector input circuit 100 according to an embodiment of the present disclosure includes input switches $110_1$, $110_2, \ldots 110_i$ corresponding to the number of elements of the input vector.

The input switches $110_1$, $110_2$, . . . $110_i$ respectively provide analog input voltages $V_{x1}, V_{x2}, \ldots V_{xi}$ to the computing cell array 200 in accordance with respective input switch control signals $S_{11}, S_{12}, \ldots S_{1i}$.

The vector input circuit 100 may further include a plurality of input buffers $120_1$, $120_2$, . . . $120_i$ which may respectively buffer the analog input voltages $V_{x1}, V_{x2}, \ldots V_{xi}$.

In FIG. 4, an embodiment in which an output signal of the input buffer $120_m$ is provided to the input switch $110_m$ is illustrated, where $1 \leq m \leq i$, but in another embodiment, the connection order may be changed so that the input switch $110_m$ may be coupled to the input terminal of the input buffer $120_m$.

Figure 5:
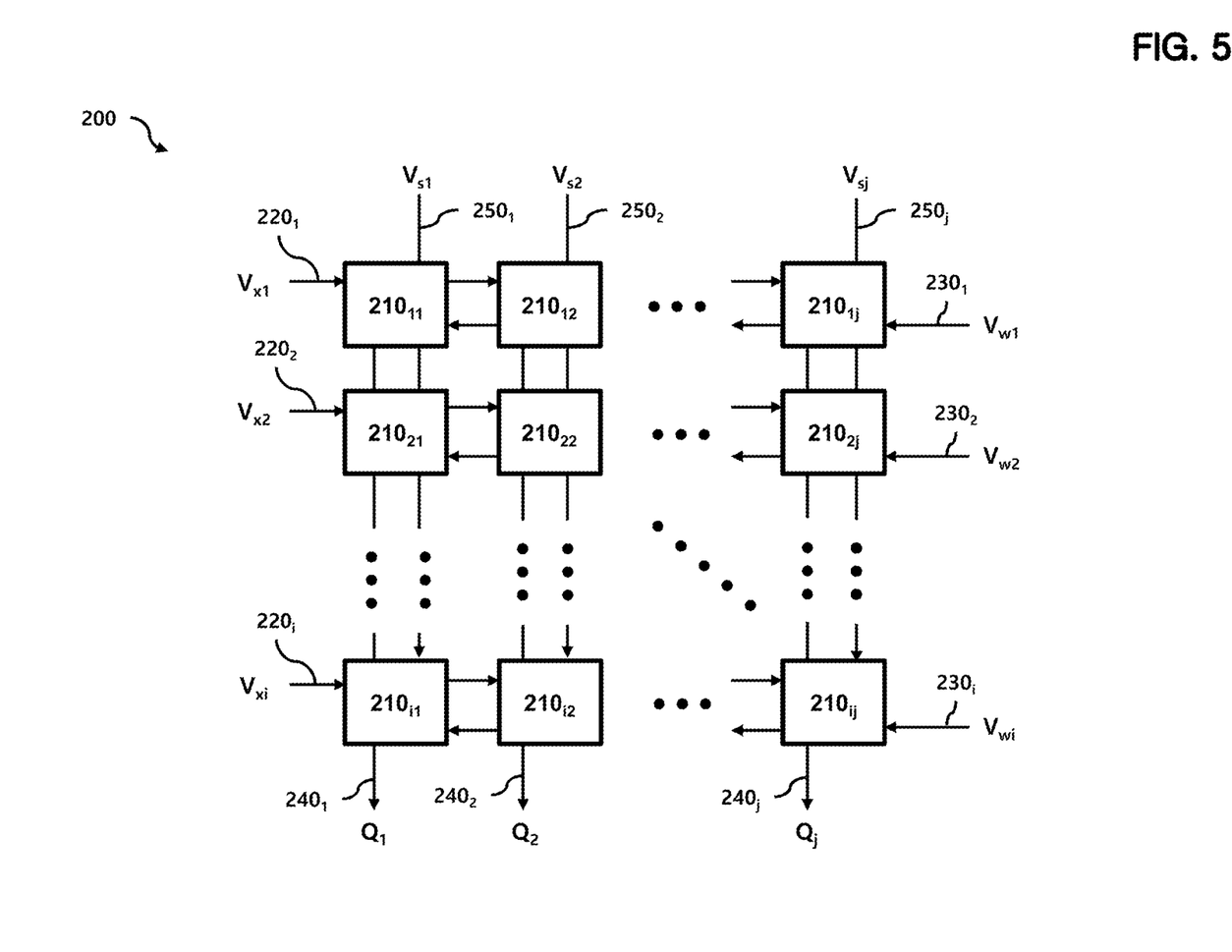
FIG. 5 is a block diagram illustrating a computing cell array according to an embodiment of the present disclosure.

FIG. 5 is a block diagram illustrating a computing cell array 200 according to an embodiment of the present disclosure.

The computing cell array 200 includes a plurality of computing cells $210_{11}$, $210_{12}, \ldots 210_{ij}$, $210_{21}$, $210_{22}$, . . . $210_{2j}, \ldots, 210_{i1}, 210_{i2}, \ldots 210_{ij}$, (collectively referred to herein as the plurality of computing cells 210) where i and j are natural numbers greater than 1.

The plurality of computing cells 210 may be arranged in i rows and j columns so that they may correspond to the elements of the matrix which the input vector will be multiplied by to produce the output vector.

The computing cell array 200 includes a plurality of plate lines $220_1$, $220_2, \ldots 220_i$ (collectively, plate lines 220), a plurality of first word lines $230_1$, $230_2, \ldots 230_i$ (collectively, first word lines 230), a plurality of bit lines $240_1$, $240_2, \ldots 240_j$ (collectively, bit lines 240), and a plurality of control lines $250_1$, $250_2$, . . . $250_j$ (collectively, control lines 250).

In the present embodiment, the plate lines 220 and the first word lines 230 are arranged in parallel to each other in the row direction, the bit lines 240 and the control lines 250 are arranged in parallel to each other in the column direction, and the plates line 220 and the bit lines 240 are arranged to be perpendicular to each other.

Each computing cell $210_{mn}$ intersects with the plate line $220_m$, the first word line $230_m$, the bit line $240_n$, and the control line $250_n$, for n in 1 . . . j and m in 1 . . . i.

Although FIG. 5 illustrates one first word line per row, a plurality of second word lines may be further comprised in each row. This will be described in detail with reference to FIG. 6.

The input voltage $V_{xm}$ corresponding to an element of the input vector is input to each plate line $220_m$.

The bit line $240_n$ is commonly coupled to computing cells of the n-th column, for n in 1 . . . j.

The computing cell $210_{mn}$ outputs a signal corresponding to the product of m-th element of the input vector ($V_{xm}$, which is input on the plate line $220_m$) and (m,n)-th element of the matrix (which value is stored in computing cell $210_{mn}$) to the bit line $240_n$, for n in 1 . . . j and m in 1 . . . i.

The signal $Q_n$ output from the bit line $240_n$ corresponds to the dot product of the input vector and n-th column vector of the matrix; that is, to the sum of the products output to the bit line $240_n$ by computing cells $210_{1n}$, $210_{2n}$, . . . $210_{in}$, where $1 \leq n \leq j$.

The column selection signal $V_{sn}$ is input to the control line $250_n$.

The column selection signal $V_{sn}$ may be used to program the corresponding elements of the matrix into computing cells of the n-th column of the computing cell array 200, where $1 \leq n \leq j$.

A first word line voltage $V_{wm}$ is applied to the first word line $230_m$ to program the (m, n)-th element of the matrix to the computing cell $210_{mn}$.

A detailed structure of the computing cell $210_{mn}$ and an operation related thereto will be described in detail with reference to FIG. 6.

Figure 6:
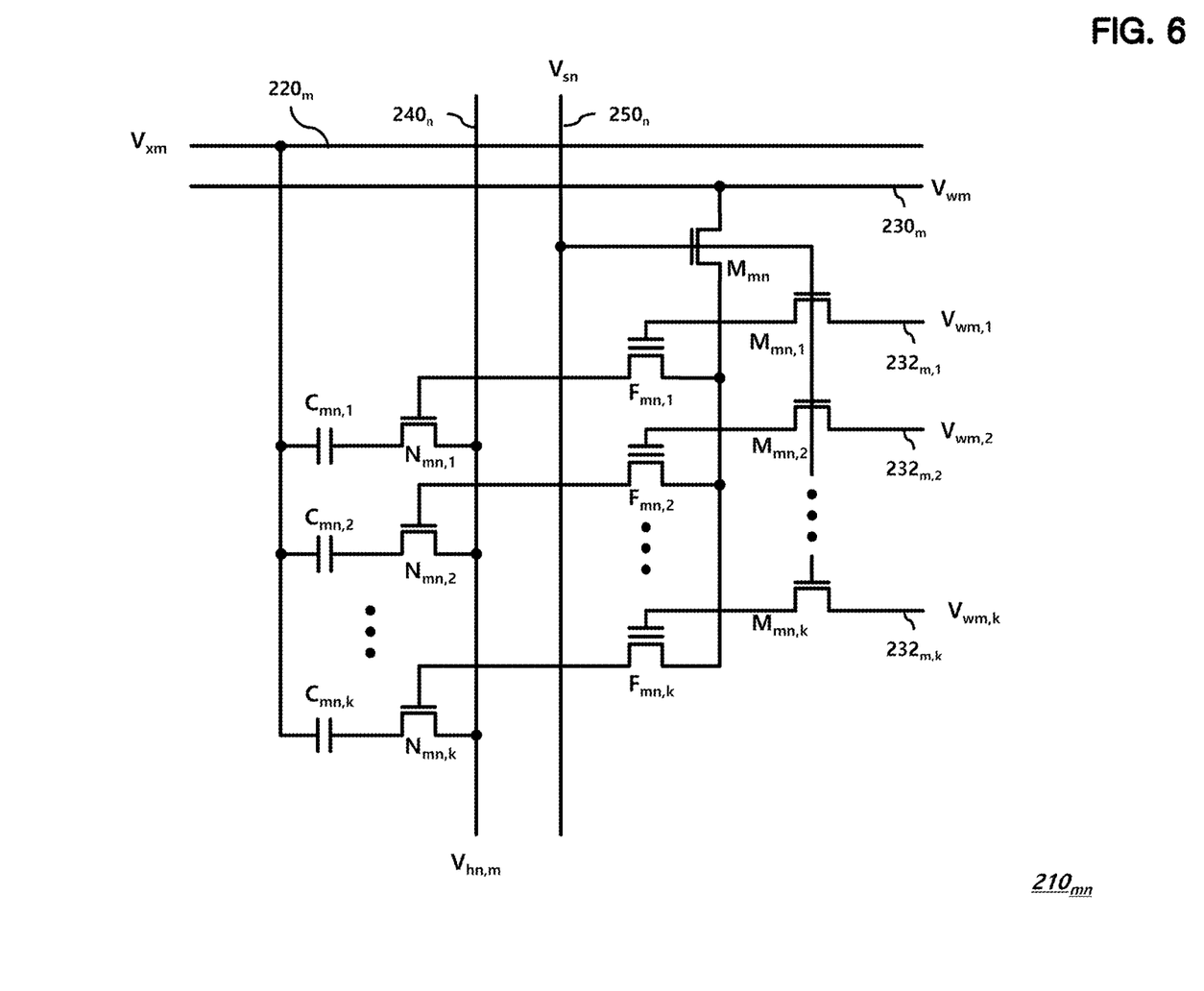
FIG. 6 is a circuit diagram illustrating a computing cell according to an embodiment of the present disclosure.

FIG. 6 is a circuit diagram illustrating a computing cell $210_{mn}$ according to an embodiment of the present disclosure.

The computing cell $210_{mn}$ includes one or more capacitors $C_{mn,1}, C_{mn,2}, \ldots C_{mn,k}$ and one or more NMOS transistors $N_{mn,1}, N_{mn,2}, \ldots N_{mn,k}$, where k is a natural numbers corresponding to a number of bits used to store a value in the computing cell $210_{mn}$.

The capacitor $C_{mn,p}$ and the NMOS transistor $N_{mn,p}$, p in 1 ... k, are coupled in a form similar to a Dynamic Random Access Memory (DRAM) cell (except that the terminal of the capacitor $C_{mn,p}$ not coupled to the NMOS transistor $N_{mn,p}$ is coupled to the plate line $220_m$ instead of to ground).

That is, one node of the capacitor $C_{mn,p}$ is coupled to the plate line $220_m$, and the source and drain of the NMOS transistor $N_{mn,p}$ are coupled between the other node of the capacitor $C_{mn,p}$ and the bit line $240_n$.

The gate of the NMOS transistor $N_{mn,p}$ is coupled to the drain of the floating gate transistor $F_{mn,p}$ among one or more floating gate transistors $F_{mn,1}, F_{mn,2}, \ldots F_{mn,k}$.

The sources of the floating gate transistors $F_{mn,1}, F_{mn,2}, \ldots F_{mn,k}$ are commonly coupled to the source of the switching transistor $M_{mn}$.

The drain of the switching transistor $M_{mn}$ is coupled to the first word line $230_m$ and the gate of the switching transistor $M_{mn}$ is coupled to the control line $250_n$.

The control gate of the floating gate transistor $F_{mn,p}$ is coupled to the drain of the switching transistor $M_{mn,p}$ of the one or more switching transistors $M_{mn,1}, M_{mn,2}, \ldots M_{mn,k}$.

The gate of the switching transistor $M_{mn,p}$ is coupled to the control line $250_n$ and the source is coupled to the second word line $232_{m,p}$ of the one or more second word lines $232_{m,1}, \ldots 232_{m,1}, \ldots 232_{m,k}$.

As such, the first word line $230_m$ and the plurality of second word lines $232_{m,1}, \ldots, 232_{m,k}$ are coupled to a computing cell $210_{mn}$.

In the present embodiment, the value of the (m, n)-th element of the matrix corresponds to a physical value of the computing cell $210_{mn}$ such as the effective capacitance between the plate line $220_m$ and the bit line $240_n$ in the computing cell $210_{mn}$.

In this embodiment, the effective capacitance between the plate line $220_m$ and the bit line $240_n$ is determined by which capacitors are coupled between the plate line $220_m$ and the bit line $240_n$ among the plurality of capacitors $C_{mn,1} \ldots C_{mn,k}$.

The floating gate transistor $F_{mn,p}$ is configured to control the gate voltage of the NMOS transistor $N_{mn,p}$ by injecting charges into the floating gate during a program operation or removing charges from the floating gate using an erase operation.

The program operation and the erase operation performed on the computing cell $210_{mn}$ may be controlled by the matrix control circuit 300.

During the program operation, a high level signal is applied to the control line $250_n$ to turn on the switching transistors $M_{mn}, M_{mn,1}, \ldots, M_{mn,k}$.

Accordingly, the first word line $230_m$ is coupled to the source of the floating gate transistors $F_{mn,p}$, and the second word line $232_{m,p}$ is coupled to the control gate of the floating gate transistor $F_{mn,p}$.

An operation for injecting or removing charges into the floating gate of the floating gate transistor $F_{mn,p}$ (that is, for programming or erasing the floating gate transistor $F_{mn,p}$) is well known in the art.

That is, electrons are injected into the floating gate of the floating gate transistor $F_{mn,p}$ by applying a positive high voltage to the second word line $232_{m,p}$ while the first word line $230_m$ is grounded. Electrons may be removed from the floating gate of the floating gate transistor $F_{mn,p}$ by applying a negative high voltage to the second word line $232_{m,p}$.

When electrons are injected into the floating gate, the threshold voltage of the floating gate transistor is increased. Accordingly, a voltage may be applied to the control gate of the floating gate transistor that will turn the floating gate transistor on if electrons have not been injected into the floating gate, but will not turn the floating gate transistor on if a sufficient number of electrons have been injected into the floating gate.

Computing operations may also be controlled by the matrix control circuit 300.

The computing operation determines whether the NMOS transistor $N_{mn,p}$ is on or off by adjusting the gate voltage of the NMOS transistor $N_{mn,p}$ according to the result of programming the floating gate transistor $F_{mn,p}$, and accordingly determines whether one or more of the capacitors $C_{mn,1} \ldots C_{mn,k}$ are conductively coupled between the plate line $220_m$ and the bit line $240_n$.

In computing operation, a high level signal is applied to the control line $250_n$ to turn on the switching transistors $M_{mn}, M_{mn,1}, \ldots, M_{mn,k}$.

The power supply voltage VDD is applied to the first word line $230_m$ and second word lines $232_{m,1}, \ldots, 232_{m,k}$ during the computing operation.

Accordingly, the floating gate transistor in which electrons are injected into the floating gate thereof is not turned on, which results in the corresponding NMOS transistor being not turned on, and the floating gate transistor in which electrons are not injected into the floating gate thereof is turned on, which results in the corresponding NMOS transistor being turned on to conductively couple the corresponding capacitor between a corresponding plate line and a corresponding bit line.

The sum of capacitances of the capacitors corresponding to the floating gate transistors in which no electrons are injected into the floating gates thereof in the computing cell $210_{mn}$, that is, the effective capacitance $C_{mn}$ of the computing cell $210_{mn}$, corresponds to the value of (m, n)-th element of the matrix.

The effective capacitance may be variously determined by increasing the number of capacitors included in the computing cell $210_{mn}$. The capacitors included in the computing cell $210_{mn}$ may be set to have an identical capacitance or different capacitances. These can be changed according to embodiments. For example, in an embodiment each capacitor $C_{mn,p}$ has a capacitance equal to $c*2^{(p-1)}$ for p in 1 ... k, where c is a constant, so that the effective capacitance $C_{mn}$ may be determined by programming a binary number into the floating gate transistors $F_{mn,1} \ldots F_{mn,k}$. In another embodiment, some of the floating gate transistors $F_{mn,1} \ldots F_{mn,k}$ may be coupled to more than one transistor-capacitor chain, such that some of the floating gate transistors $F_{mn,1} \ldots F_{mn,k}$ respectively control whether more than one capacitor is conductively coupled between a corresponding plate line and a corresponding bit line. For example, each floating gate transistors $F_{mn,p}$, for p in 1 ... k, may control $2^{(p-1)}$ capacitors through associated transistors, so that the effective capacitance $C_{mn}$ may be determined by programming a binary number into the floating gate transistors $F_{mn,1} \ldots F_{mn,k}$.

The computing result in each computing cell $210_{mn}$ corresponds to the product of the input voltage $V_{xm}$ input to the plate line $220_m$ and the effective capacitance $C_{mn}$, which corresponds to the amount of charge charged in the capacitor.

Since the bit line $240_n$ and the control line $250_n$ are common to a plurality of computing cells in the same column, the program operation and the computing operation may be performed on a per-column basis. In an embodiment performing a matrix multiplication operation, the computing operation for each column may be performed simultaneously with the computing operation of the other columns.

In addition, since the operation is performed on a column basis, a positive charge corresponding to the dot product of the input vector and the n-th column vector of the matrix may be output from the n-th bit line $240_n$. That is, each computing cell $210_{mn}$, for m in 1 . . . i, coupled to the n-th bit line $240_n$ and programmed to have an effective capacitance corresponding to the matrix value $W_{mn}$ contributes a charge corresponding to a voltage value of the plate line $220_m$ to which it is coupled multiplied by its effective capacitance. The contributed charge of the computing cell $210_{mn}$ therefor corresponding to $x_m \cdot W_{mn}$. The total contribution of charge to the bit line $240_n$ corresponds to the sum of the charges produced by the computing cells coupled thereto: $x_1 \cdot W_{1n} + x_2 \cdot W_{2n} + \ldots x_i \cdot W_{in}$.

Figure 7:
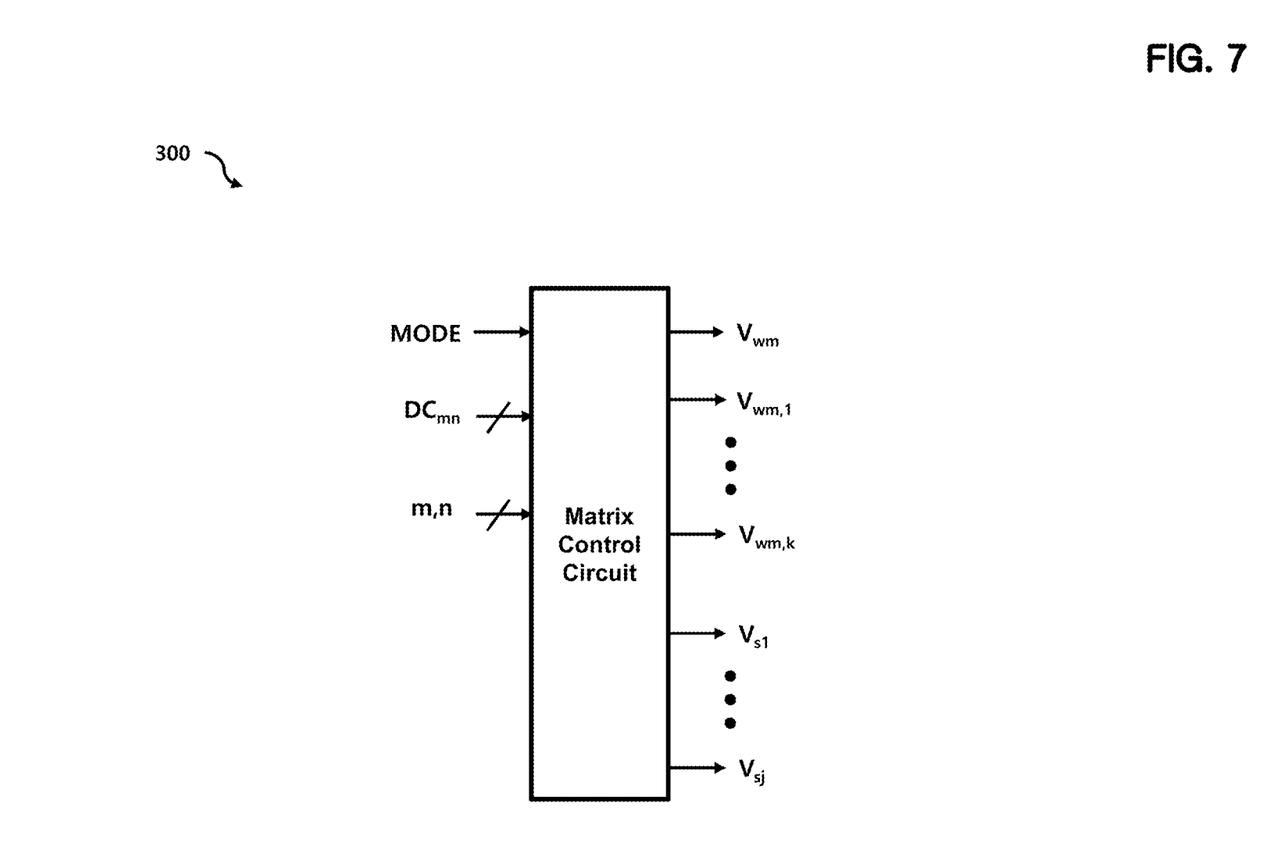
FIG. 7 is a block diagram illustrating a matrix control circuit according to an embodiment of the present disclosure.

FIG. 7 is a block diagram illustrating a matrix control circuit 300 according to an embodiment of the present disclosure.

The matrix control circuit 300 programs the floating gate transistors as described above with respect to the plurality of computing cells included in the computing cell array 200 to determine an effective capacitance corresponding to each computing cell.

The matrix control circuit 300 provides a plurality of column selection signals $V_{sn}$ to select columns for performing program operations and computing operations, and provides first word line voltages $V_{wm}$ and second word line voltages $V_{wm,p}$ to provide values for programming the floating gate transistors of the computing cells.

The matrix control circuit 300 may perform a program operation or a computing operation by receiving an operation mode signal MODE. The matrix control circuit 300 may receive element data $DC_{mn}$ corresponding to each computing cell and determine a first word line voltage $V_{wm}$ and the second word line voltages $V_{wm,p}$ during a program operation.

Determining which of the NMOS transistor $N_{mn,p}$ are to be turned on according to the value of the element data $DC_{mn}$ may be performed in variously ways by those skilled in the art, and correspondingly, the values of the first word line voltage $V_{wm}$ and second word line voltages $V_{wm,p}$ to be provided in the program operation may be easily determined by a person skilled in the art from the above-described disclosure, and thus a detailed description thereof will be omitted.

Whether an $n^{th}$ column performs a program operation or a computing operation may be determined by adjusting the level of the column selection signal $V_{sn}$.

The computing control circuit 500 may control the matrix control circuit 300 to perform a program operation or a computing operation.

Figure 8:
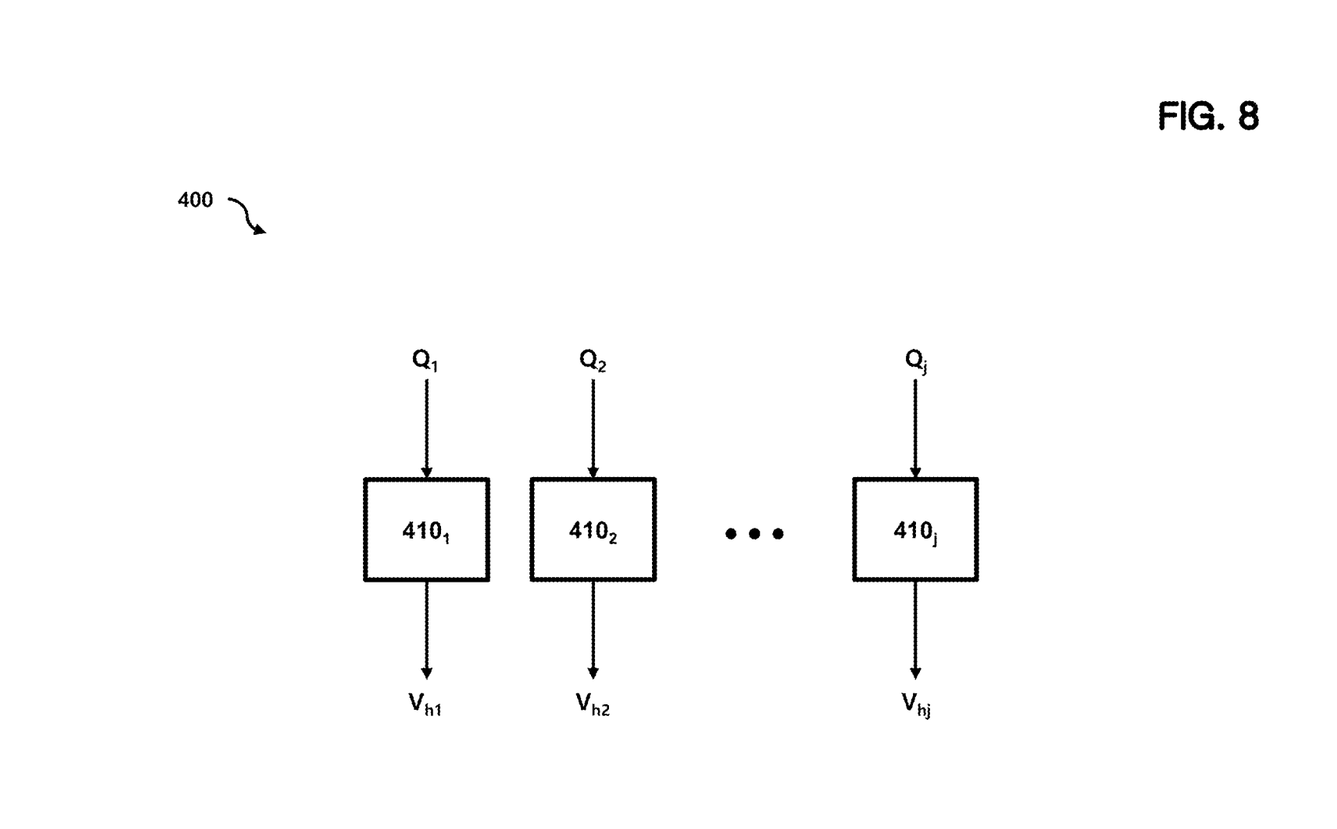
FIG. 8 is a block diagram illustrating a vector output circuit according to an embodiment of the present disclosure.

FIG. 8 is a block diagram illustrating a vector output circuit 400 according to an embodiment of the present disclosure.

The vector output circuit 400 includes a plurality of element output circuits $410_1, 410_2, \ldots 410_j$.

As described above, the charge amount $Q_n$ output from the bit line $240_n$ corresponds to the dot product of the input vector and the n-th column vector of the matrix.

The element output circuits $410_n$, n in 1 . . . j, converts the charge amount $Q_n$ into an output voltage $V_{hn}$ corresponding to the dot product of the input vector and the n-th column vector of the matrix and outputs the output voltage $V_{hn}$.

Figure 9:
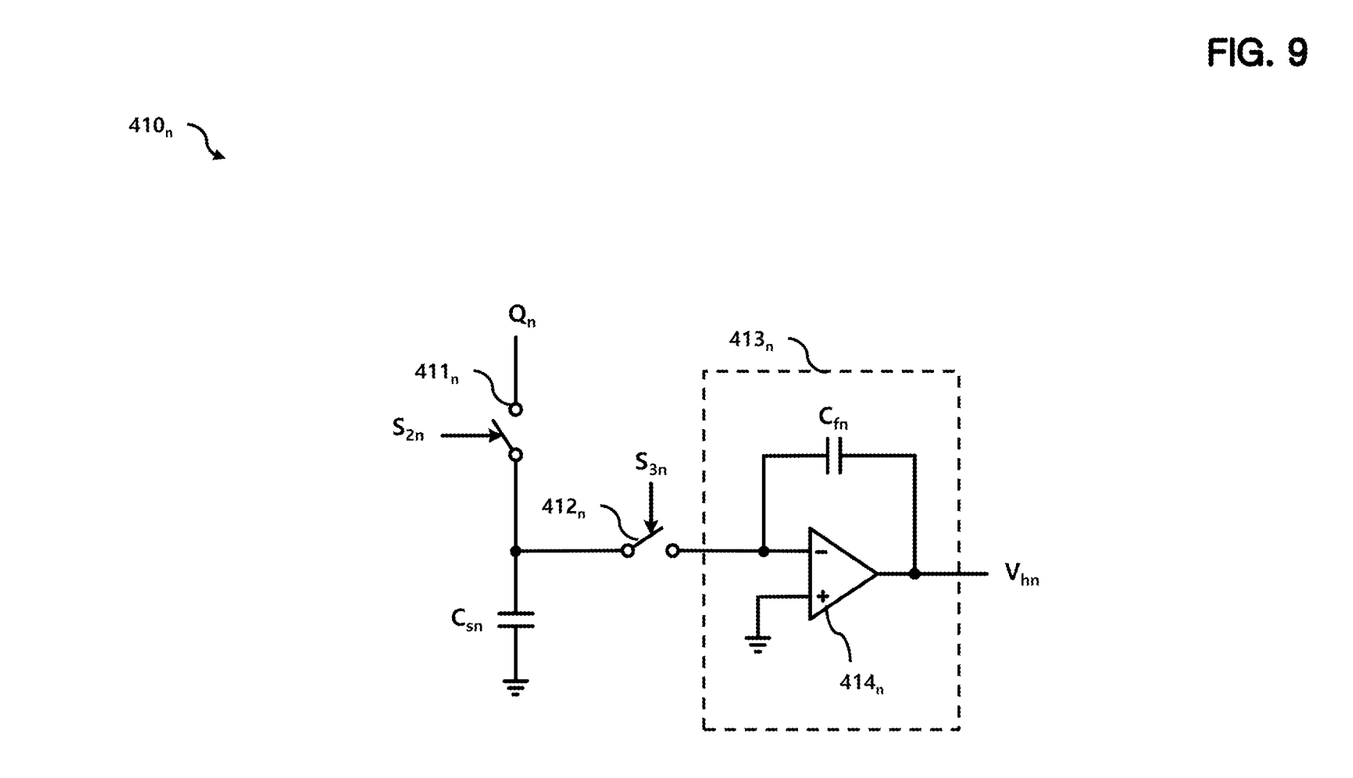
FIG. 9 is a circuit diagram illustrating an element output circuit according to an embodiment of the present disclosure.

FIG. 9 is a circuit diagram illustrating an element output circuit $410_n$ according to an embodiment of the present disclosure.

The element output circuit $410_n$ includes a sampling capacitor $C_{sn}$, a sampling switch $411_n$, a conversion switch $412_n$, and a conversion circuit $413_n$.

In this embodiment, the sampling switch $411_n$ is controlled according to the sampling switch control signal $S_{2n}$, and the conversion switch $412_n$ is controlled according to the conversion switch control signal $S_{3n}$.

In the present embodiment, the sampling switch $411_n$ is turned off and then turned on after the input switch $110_m$ of FIG. 4 is turned on to charge the capacitors $C_{mn,\,1}, \ldots, C_{mn,\,k}$ of FIG. 6.

Accordingly, the charge $Q_n$ transferred through the bit line $240_n$ is transferred to the sampling capacitor $C_{sn}$.

After the sampling switch $411_n$ is turned off and the conversion switch $412_n$ is turned on, the conversion circuit $413_n$ generates an output voltage $V_{hn}$ corresponding to the charge charged in the sampling capacitor $C_{sn}$.

In the present embodiment, the conversion circuit $413_n$ is an amplifier circuit including an operational amplifier $414_n$ and a feedback capacitor $C_{fn}$ and generates an output voltage $V_{hn}$ corresponding to the capacitance of the sampling capacitor $C_{sn}$ and the feedback capacitor $C_{fn}$ and buffers the output voltage $V_{hn}$.

As described above, the element output circuit $410_n$ including the conversion circuit $413_n$ adjusts the signal such that the output voltage $V_{hn}$ has a value corresponding to the dot product of the input vector and the n-th column vector of the matrix.

Figure 10:
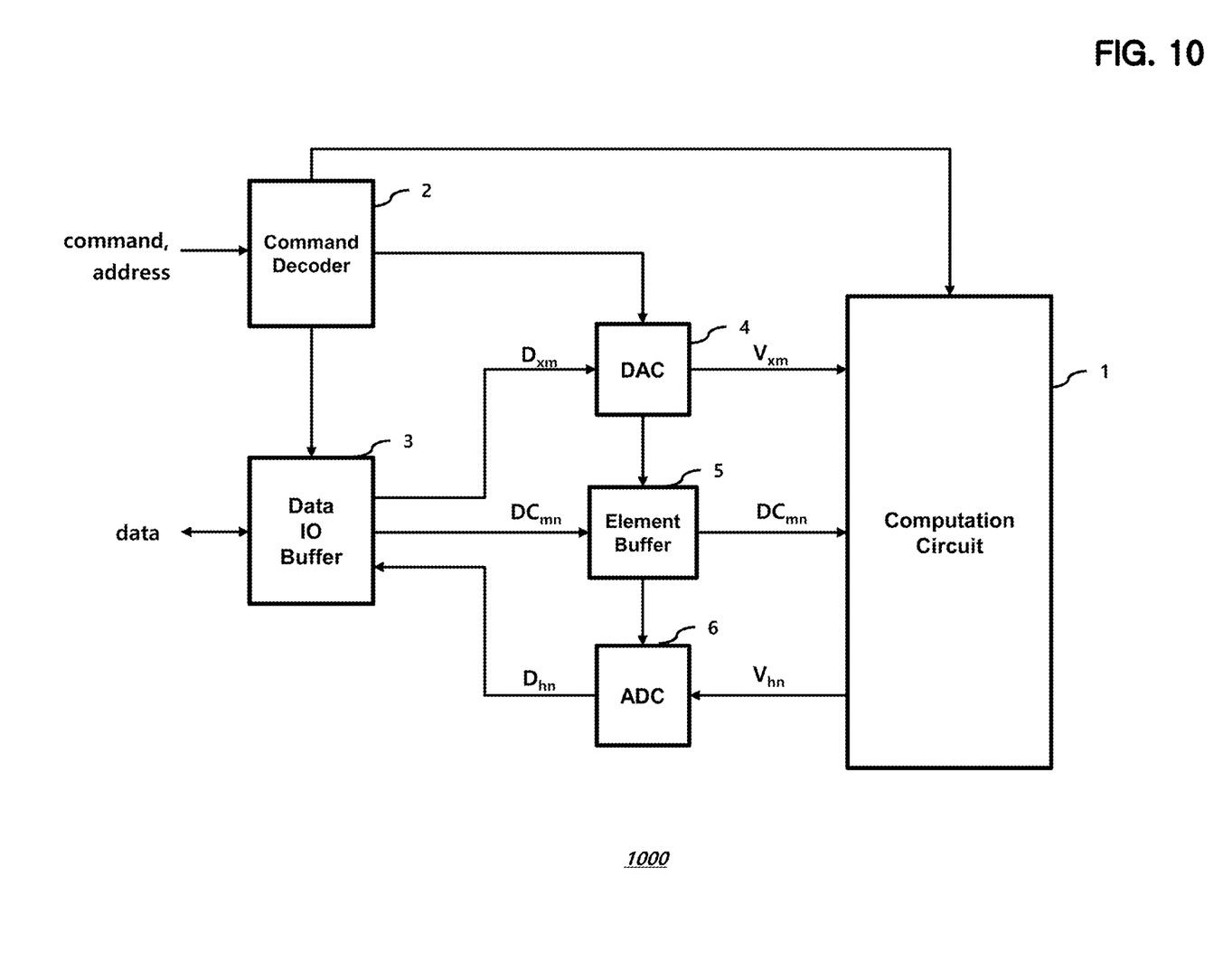
FIG. 10 is a block diagram illustrating a semiconductor device according to an embodiment of the present disclosure.

FIG. 10 is a block diagram illustrating a semiconductor device 1000 according to an embodiment of the present disclosure.

The semiconductor device 1000 according to the embodiment of the present disclosure includes a structure similar to that of a semiconductor memory device such as a DRAM.

The semiconductor device 1000 includes a command decoder 2 and a data input/output (IO) buffer 3.

The semiconductor device 1000 according to an embodiment of the present disclosure may further include a computation circuit 1, a digital to analog converter (DAC) 4, an element buffer 5, and an analog to digital converter (ADC) 6.

Since the configuration and operation of the computation circuit 1 are as described above, detailed description thereof is omitted.

The command decoder 2 controls the computation circuit 1, the data IO buffer 3, the DAC 4, the element buffer 5, and the ADC 6 according to the command and the address.

The command decoder 2 receives a command and an address from the memory controller.

In this case, the command may include a read command, a write command (a program command), a computation command, and etc.

Write commands include a vector write command for writing an input vector and a matrix write command for writing a matrix.

Input data $D_{xm}$, for m in 1 . . . i, corresponding to elements included in the input vector may be provided to the data IO buffer 3 by executing vector write commands.

In this case, the address corresponding to the vector write command may include information on the element number m of the input vector.

In the present embodiment, the input data $D_{xm}$ is a digital signal and the command decoder 2 controls the DAC 4 to generate an input voltage $V_{xm}$ corresponding to the input data $D_{xm}$ and to provide the input voltage $V_{xm}$ to the computation circuit 1 when a vector write command is provided. In an embodiment, the DAC 4 produces a plurality of input voltages $V_{xm}$ each corresponding to a respective input data $D_{xm}$, for m in 1 ... i.

The vector input circuit 100 may maintain the input voltages $V_{xm}$ using the buffer 120$_m$.

By executing a matrix write command, element data $DC_{mn}$ corresponding to an element included in the matrix may be provided to the element buffer 5.

In this case, the address corresponding to the matrix write command may include a row number and a column number corresponding to the element of the matrix.

The computation circuit 1 programs a plurality of floating gate transistors of a computing cell 210$_{mn}$ included in the computing cell array 200 according to the element data $DC_{mn}$ provided from the element buffer 5 and the commands and addresses provided from the command decoder 2.

The computing command indicates that a multiplication of the matrix and the input vector currently input is to be performed.

Accordingly, the command decoder 2 controls the computation circuit 1 to perform computing operations.

In the computing operation, when the column select signal $V_{sn}$ and the first and second word line voltages $V_{wm}$ and $V_{wm,p}$ are applied, depending on whether charge has been injected into the respective floating gates of the floating gate transistors of the computing cell 210$_{mn}$, effective capacitance $C_{mn}$ of the computing cell 210$_{mn}$ is determined.

For the computing operation, the input switch 110$_m$ of FIG. 4 is turned on while the sampling switch 411$_n$ of FIG. 9 is turned off to charge the capacitor $C_{mn,p}$ of the computing cell 210$_{mn}$ according to the input voltage $V_{xm}$.

Thereafter, the sampling switch 411$_n$ is turned on to charge the sampling capacitor $C_{sn}$ according to the charge $Q_n$ provided from the bit line 240$_n$.

Thereafter, the sampling switch 411$n$ is turned off and the conversion switch 412$_n$ is turned on to generate the output voltage $V_{hn}$.

The read command corresponds to an operation of outputting an output voltage $V_{hn}$ corresponding to each element of the output vector.

In the read command, the corresponding address may indicate an element number of the output vector to be read.

When a read command is provided, the output voltage $V_{hn}$ corresponding to the element number is provided by the computation circuit 1 and converted into the output data $D_{hn}$ by the ADC 6, and the converted data is output through the data IO buffer 3.

Although various embodiments have been described for illustrative purposes, it will be apparent to those skilled in the art that various changes and modifications may be made to the described embodiments without departing from the spirit and scope of the disclosure as defined by the following claims.

What is claimed is:

1. A computation circuit comprising:
   a computing cell array configured to provide a plurality of effective capacitances respectively corresponding to a plurality of elements of a matrix;
   a vector input circuit configured to provide a plurality of input voltages corresponding to an input vector to the computing cell array; and
   a vector output circuit configured to output a plurality of output voltages each corresponding to a dot product between the input vector and a column vector of the matrix according to the plurality of input voltages and the plurality of effective capacitances,
   wherein the computing cell array comprises:
   a plurality of computing cells;
   a plurality of plate lines; and
   a plurality of bit lines,
   wherein each of the plurality of computing cells is located where a respective one of the plurality of plate lines and a respective one of the plurality of the bit lines cross,
   wherein each of the plurality of computing cells includes a plurality of capacitors selectively coupled between the respective one of the plurality of plate lines and the respective one of the plurality of bit lines; and
   wherein an effective capacitance between the respective one of the plurality of plate lines and the respective one of the plurality of bit lines respectively corresponds to a value of an element included in the matrix.

2. The computation circuit of claim 1, wherein each of the plurality of computing cells includes:
   a plurality of MOS transistors configured to selectively couple the plurality of capacitors with the respective one of the plurality of plate lines; and
   a plurality of nonvolatile transistors configured to respectively determine on or off states of the plurality of MOS transistors.

3. The computation circuit of claim 2, wherein the computing cell array further comprises a plurality of first word lines corresponding to a number of rows of the matrix, and
   wherein each of the plurality of first word lines is coupled to a gate of a corresponding one of the plurality of MOS transistors through a corresponding one of the plurality of nonvolatile transistors.

4. The computation circuit of claim 3, wherein the computing cell array further comprises a plurality of second word lines, and
   wherein a gate of each of the plurality of nonvolatile transistors is coupled to one of the plurality of second word lines, and
   wherein the computing cell array is configured to program each of the plurality of nonvolatile transistors according to a voltage of one of the plurality of second word lines.

5. The computation circuit of claim 4, wherein the computing cell array further comprises a plurality of control lines, and
   wherein each of the plurality of computing cells further includes:
   a transistor configured to selectively couple one of the plurality of first word lines to the plurality of nonvolatile transistors of the computing cell according to one of the plurality of control lines, and
   a plurality transistors respectively selectively coupling gates of the plurality of nonvolatile transistors of the computing cell to respective ones of the plurality of second word lines according to the one of the plurality of control lines.

6. The computation circuit of claim 1, wherein the vector output circuit includes a plurality of element output circuits each configured to generate a respective output voltage among the plurality of output voltages according to a signal provided from a respective one of the plurality of bit lines.

7. The computation circuit of claim 6, wherein each of the plurality of element output circuits includes:
   a sampling capacitor coupled to the respective one of the plurality of bit lines; and
   a conversion circuit configured to generate the respective output voltage according to charges charged in the sampling capacitor.

8. The computation circuit of claim 7, wherein each of the plurality of element output circuits further includes:
a sampling switch configured to selectively couple the respective one of the plurality of bit lines and the sampling capacitor; and
a conversion switch configured to selectively provide charges charged in the sampling capacitor to the conversion circuit.

9. The computation circuit of claim 1, wherein the vector input circuits includes:
a plurality of input buffers configured to respectively buffer the plurality of input voltages; and
a plurality of input switches configured to selectively provide output voltages of the plurality of input buffers to the computing cell array.

10. The computation circuit of claim 1, further comprising a matrix control circuit configured to set effective capacitances corresponding to each element of the matrix in the computing cell array.

11. A semiconductor device comprising:
a command decoder configured to receive a command and an address;
a data input/output (IO) buffer configured to input or output data according to a control of the command decoder; and
a computation circuit configured to generate a plurality of output voltages corresponding to product of an input vector provided from the data IO buffer and a matrix according to a control of the command decoder,
wherein the computation circuit comprises:
a computing cell array configured to set and store a plurality of effective capacitances respectively corresponding to the elements of the matrix;
a vector input circuit configured to provide a plurality of input voltages corresponding to an input vector to the computing cell array; and
a vector output circuit configured to output a plurality of output voltages each corresponding to a dot product between the input vector and a column vector of the matrix according to the plurality of input voltages and the plurality of effective capacitances,
wherein the computing cell array comprises:
a plurality of computing cells;
a plurality of plate lines; and
a plurality of bit lines,
wherein each of the plurality of computing cells is located where one of the plurality of plate lines and one of the plurality of the bit lines cross,
wherein each of the plurality of computing cells includes a plurality of capacitors selectively coupled between one of the plurality of plate lines and one of the plurality of bit lines; and
wherein an effective capacitance between one of the plurality of plate lines and one of the plurality of bit lines corresponds to a value of an element included in the matrix.

12. The semiconductor device of claim 11, further comprising a digital to analog converter (DAC) configured to convert a data of the data IO buffer into an input voltage corresponding to an element of the input vector and to provide the input voltage with the computation circuit according to a control of the command decoder.

13. The semiconductor device of claim 11, further comprising an analog to digital converter (ADC) configured to convert the plurality of output voltages into a plurality of output data and provide the output data with the data IO buffer according to a control of the command decoder.

14. The semiconductor device of claim 11, further comprising an element buffer configured to receive element data corresponding to an element of the matrix from the data IO buffer and to buffer the element data according to a control of the command decoder.

15. The semiconductor device of claim 11, wherein each of the plurality of computing cells includes:
a plurality of MOS transistors configured to selectively couple, respectively, the plurality of capacitors with the one of the plurality of plate lines; and
a plurality of nonvolatile transistors configured to respectively determine an on or off state of the plurality of MOS transistors.

16. The semiconductor device of claim 11, wherein the vector output circuit comprises a plurality of element output circuits, each of the plurality of element output circuits including:
a sampling switch configured to selectively couple a respective one of the plurality of bit lines and a sampling capacitor; and
a conversion switch configured to selectively provide charges charged in the sampling capacitor to a conversion circuit.

17. The semiconductor device of claim 11, wherein the vector input circuits includes:
a plurality of input buffers configured to respectively buffer the plurality of input voltages; and
a plurality of input switches configured to selectively provide voltages of the plurality of input buffers, respectively, to the computing cell array.

* * * * *